United States Patent
Poeppelman

(12) 
(10) Patent No.: US 6,617,985 B1
(45) Date of Patent: Sep. 9, 2003

(54) METHOD AND/OR APPARATUS FOR IMPLEMENTING CONSTRAINT CODES WITH LOW ERROR PROPAGATION

(75) Inventor: Alan D. Poeppelman, Ft. Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/122,537

(22) Filed: Apr. 15, 2002

(51) Int. Cl.⁷ ................................................ H03M 7/00
(52) U.S. Cl. ............................ 341/94; 341/59; 341/58; 714/794; 714/795
(58) Field of Search .......................... 341/94, 59, 58; 714/794, 795, 786, 781, 796, 701

(56) References Cited

U.S. PATENT DOCUMENTS

| 5,220,568 | A | * | 6/1993 | Howe et al. .................. 341/94 |
| 5,373,513 | A | * | 12/1994 | Howe et al. .................. 341/94 |
| 5,483,236 | A | * | 1/1996 | Bi ................................ 341/94 |
| 5,671,236 | A | * | 9/1997 | Denissen et al. ............. 341/58 |
| 5,740,186 | A | * | 4/1998 | Widmer ........................ 341/59 |
| 6,018,304 | A | * | 1/2000 | Bessios ....................... 341/58 |
| 6,259,385 | B1 | * | 7/2001 | Feygin et al. ................ 341/59 |

* cited by examiner

*Primary Examiner*—Michael Tokar
*Assistant Examiner*—Lam T. Mai
(74) *Attorney, Agent, or Firm*—Christopher P. Maiorana, PC

(57) ABSTRACT

A method for generating constraint codes in a stream of data having a plurality of multi-bit source words, comprising the steps of (A) checking a sequence portion of the multi-bit source words for one or more constraint violations and (B) if no constraint violations are detected, modifying a predetermined portion of each of the multi-bit source words to generate a plurality of corresponding multi-bit code words configured to prevent the constraint violations of the sequence portions across an adjacent two of the multi-bit code words.

19 Claims, 5 Drawing Sheets

US 6,617,985 B1

METHOD AND/OR APPARATUS FOR IMPLEMENTING CONSTRAINT CODES WITH LOW ERROR PROPAGATION

FIELD OF THE INVENTION

The present invention relates to error propagation in storage devices generally and, more particularly, to a method and/or apparatus for implementing constraint codes with low error propagation.

BACKGROUND OF THE INVENTION

Read channel integrated circuits are used in magnetic storage. Such read channel integrated circuits often contain significant digital signal processing and error correction logic to reliably reconstruct the original data stored on the media. Conventional read channel integrated circuits often introduce error propagation, which can adversely effect the performance of the storage if the error is excessive.

It would be desirable to implement a method and/or apparatus for implementing constraint codes in a read channel that introduces little or no error propagation.

SUMMARY OF THE INVENTION

The present invention concerns a method for generating constraint codes in a stream of data having a plurality of multi-bit source words, comprising the steps of (A) checking a sequence portion of the multi-bit source words for one or more constraint violations and (B) if no constraint violations are detected, modifying a predetermined portion of each of the multi-bit source words to generate a plurality of corresponding multi-bit code words configured to prevent the constraint violations of the sequence portions across an adjacent two of the multi-bit code words.

The objects, features and advantages of the present invention include providing a method and/or apparatus for implementing constraint codes in a read channel integrated circuit that may (i) be implemented while introducing minimal additional error propagation, (ii) be implemented in connection with existing read channel devices, (iii) be implemented with minimal coding overhead, and/or (iv) be implemented easily.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
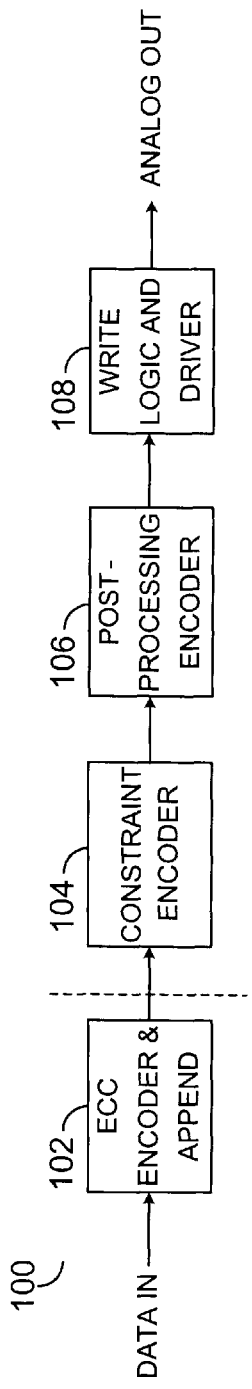
FIG. 1 is a block diagram of an encode process illustrating a context of one aspect of the present invention.
Figure 2:
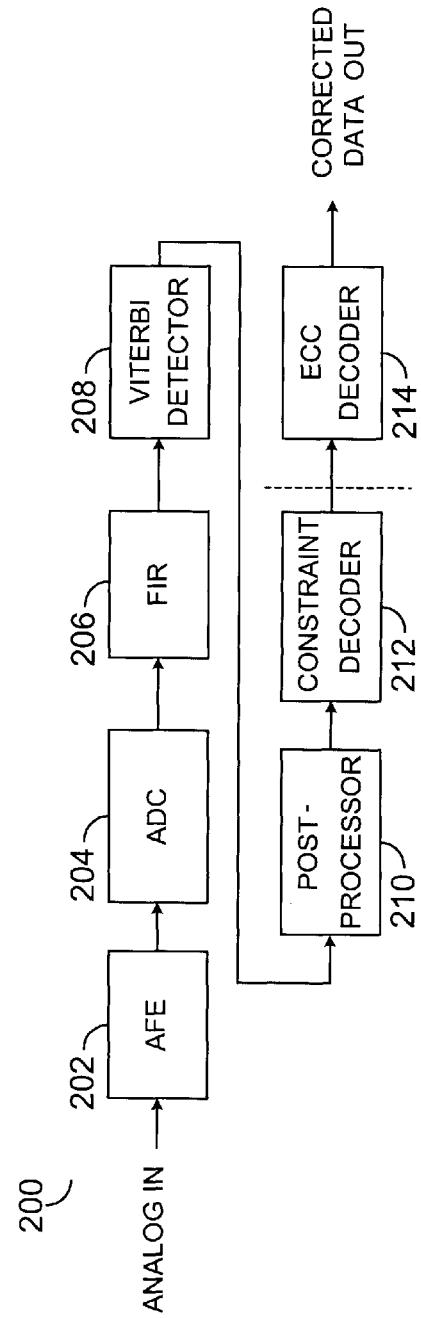
FIG. 2 is a block diagram of a decode process illustrating a context of another aspect of the present invention.

Referring to FIG. 1, a circuit 100 is shown generally comprising an error correction code (ECC) encoder and append circuit 102, a constraint encoder 104, a post-processing encoder 106, and a write logic and driver circuit 108. The circuit 100 illustrates a context of one aspect (e.g., encoding) of the present invention. Referring to FIG. 2, a circuit 200 is shown generally comprises an analog front end (AFE) circuit 202, an analog to digital converter (ADC) circuit 204, a finite impulse response (FIR) circuit 206, a Viterbi detector 208, a post processor 210, a constraint decoder 212 and an error correction code (ECC) decoder 214. The circuit 200 illustrates a context of another aspect (e.g., decoding) of the present invention.

The present invention involves an implementation of the constraint encoder 104 and the constraint decoder 212. The general purpose of the constraint encoder 104 is to eliminate certain undesirable sequences from a data stream for timing recovery, Viterbi Detector convergence, error reduction, and/or other reasons. One example of a basic constraint encoder is a run length limited (RLL) encoder which removes all sequences of contiguous zeroes from a data stream that are beyond a certain length. However, the present invention may be implemented in connection with any appropriate encoding and/or decoding circuits to meet the design criteria of a particular application.

One desirable property of a constraint code is that errors are not propagated in a significant way. Low error propagation generally allows the ECC circuit 102 to maintain the full power of correction without being diluted by small errors propagating into large errors. For example, a three bit long error may occur in the coded word. The constraint coding method of the present invention may be configured to confine the error to the three erroneous bits and/or another small area when the coded word is decoded. In the example of a forty bit word, a decoded word having an error of forty bits would-generally be undesirable. Other desirable properties of a constraint code are (i) small coding overhead and (ii) easy implementation. A method of constructing a code with one or more desirable properties in accordance with the present invention will be described in detail as follows.

An example of code construction in accordance with the present invention will be described in connection with a plurality of 40/41 source/code words (e.g., 40 source bits coded into 41 code bits). In such an example, the code words may be implemented having a global constraint of no more than 13 consecutive zeroes (e.g., logical LOW) and an interleave constraint of no more than 12 consecutive zeroes on either even or odd interleaves. For example, a global constraint violation may be indicated when there are more than 13 consecutive zeros in a word. An interleave constraint violation may be indicated when there are more than 12 consecutive zeros in an even or an odd interleave in a word (see examples of global and interleave constraint violations below). However, any appropriate predetermined type (e.g., logic state) and/or bit width global and/or interleave constraint may be implemented to meet the design criteria of a particular application. For example, a global (G) constraint violation of 14 consecutive zeroes (illustrated as the underlined zeros) may be illustrated as:

10101010111<u>00000000000000</u>1110011000010101

An example of an interleave (I) constraint violation of 13 consecutive zeroes on an even or odd interleave (illustrated as the underlined zeros) may be illustrated as:

1110101011<u>1010101010101010101010101</u>011101

The code construction process of the present invention may be broken down into three main pieces (e.g., steps, routines, processes, etc.) (1) suffix-generation, (2) sequence replacement, and (3) constraint breaking bit stuffing. Suffix generation is generally implemented when the source word has no internal constraint violations. Sequence replacement and constraint breaking bit stuffing are generally implemented when the source word has an internal constraint violation.

Figure 3:
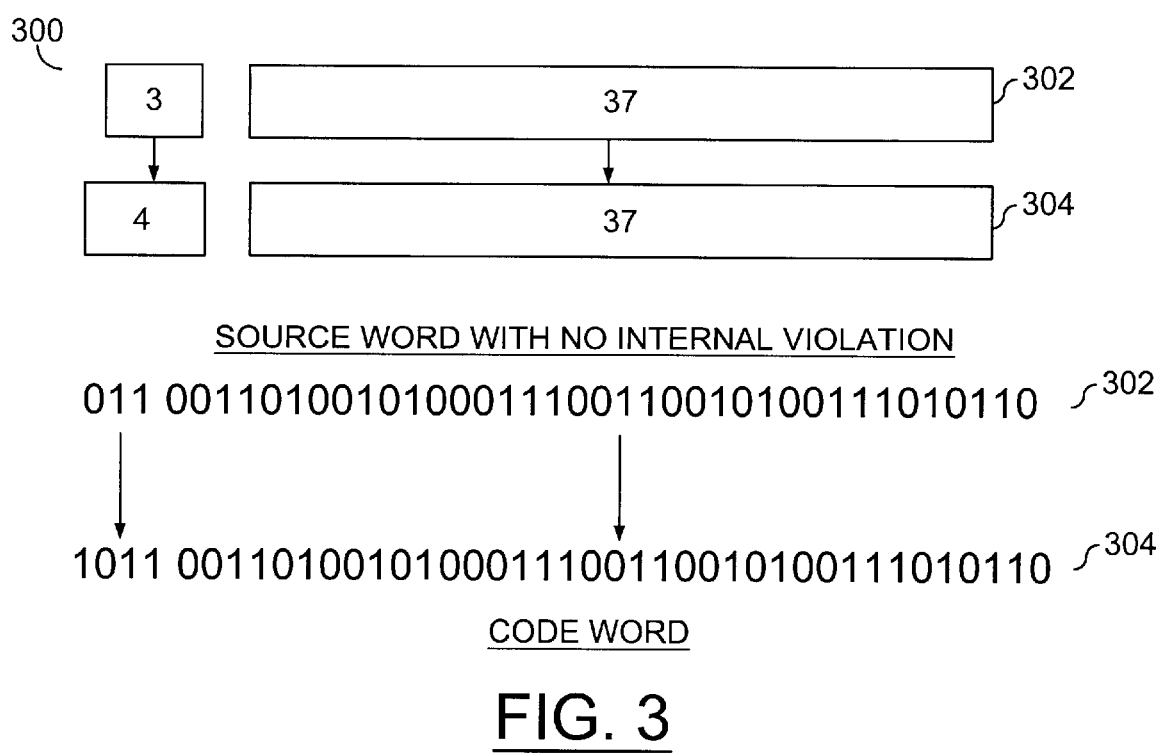
FIG. 3 is a diagram illustrating an example of suffix generation and replacement in accordance with a preferred embodiment of the present invention.

Referring to FIG. 3, an example of a suffix generation step (process) 300 is shown. Suffix generation 300 generally takes a small number of bits (e.g., 3) from a source word 302 and maps the bits into a larger number of bits (e.g., 4) of a code word 304. The term suffix generation is a general term used to describe the manipulation of only a few bits of the sequence (e.g., the last few bits of a large sequence). Since the upper few bits (e.g., most significant bits) are used in the example shown, the term suffix generation is used. Similar methods to those described herein may be implemented for more or fewer bits, other bits in the beginning of the source word (e.g., prefix or least significant bits) and/or any appropriate predetermined bits elsewhere in the source word 302. These predetermined (e.g., suffix, prefix, etc.) bits are generally implemented to break and/or prevent any predetermined constraint violation across code words 304 and to provide a unique code (e.g., mark) to indicate whether sequence replacement was implemented. In the 3-bit example for the 40-bit source word 302, 3 source bits are generally mapped (modified) into corresponding 4 code bits at the respective (e.g., most significant bits) predetermined portion of the corresponding 41-bit code word 304 as follows:

| Source | >> | Encoded |
|---|---|---|
| 000 | >> | 0110 |
| 001 | >> | 1001 |
| 010 | >> | 0111 |
| 011 | >> | 1011 |
| 100 | >> | 1100 |
| 101 | >> | 1101 | where a sequence replacement mark (SRM)=0011 may be implemented to indicate that a sequence replacement step (to be described in connection with FIG. 4) has been implemented.

Note that the encoded suffixes in the code word 304 are generally designed to break any global or interleave constraint in the source words 302. Also note that each sequence replacement mark is generally unique (e.g., not part of the encoded suffix set). However, any appropriate source to encoded bit sequence and/or sequence replacement mark may be implemented to meet the design criteria of a particular application.

In one example, the suffix generation step 300 generally checks the source word 302 for a Global (G) or Interleave (I) violation of 12 bits or more. If no violation is detected (determined), the lower 37 bits are generally mapped one-for-one from the source word 302 to the code word 304 and the upper three bits are generally mapped into four bits of the code word 304 as shown above in the suffix encoding. Most source words 302 will generally be encoded in accordance with the three-bit to four-bit mapping sequence above since, statistically, a constraint violation may be a somewhat infrequent event. While the plurality of multi-bit source words 302 are shown as 40-bit words and the plurality of corresponding multi-bit code words 304 are shown as 41-bit words, any appropriate bit-width may be implemented for the source words 302 and the code words 304 to meet the design criteria of a particular application.

Figure 4:
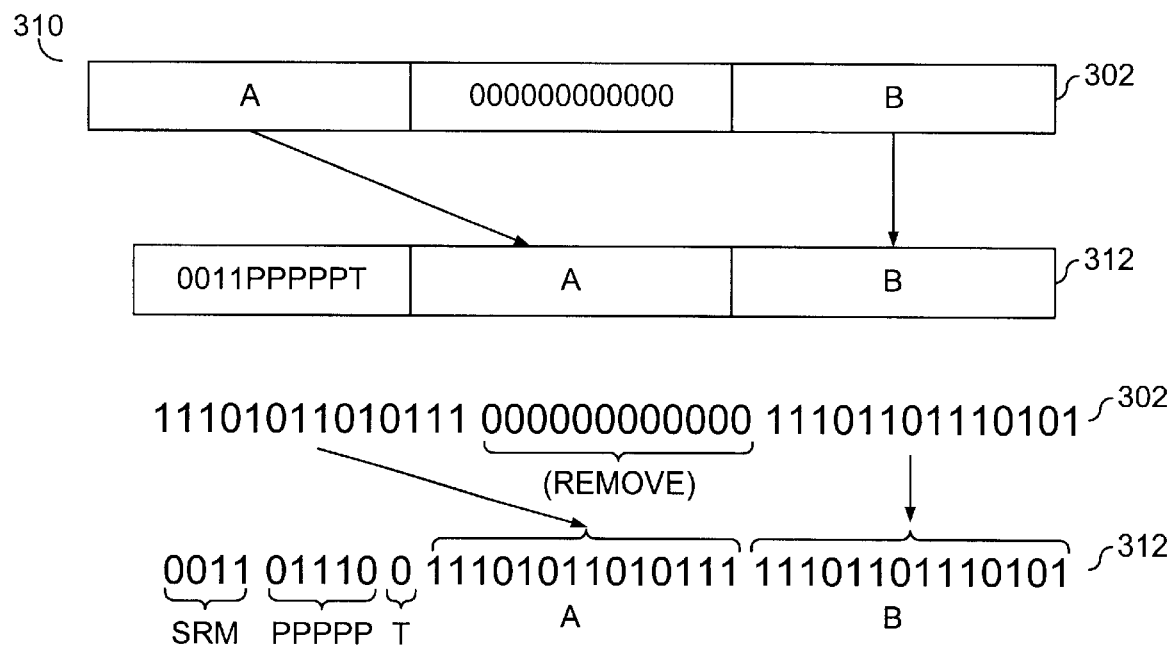
FIG. 4 is a diagram illustrating an example of sequence replacement.

Referring to FIG. 4, an example of sequence replacement step 310 is shown. Sequence replacement 310 may be implemented if the source word 302 contains a first type (e.g., an internal G or I) of constraint violation. The sequence replacement step 310 may generate a partially coded word 312. The SRM (e.g., 0011) may be implemented (inserted) as the suffix (e.g., the highest order bits or predetermined location) of the partially coded word 312. The first 12 bits of the constraint violation are generally removed from the source word 302. The higher order bit (e.g., A) of the source word 302 may be appended to the SRM (e.g., 0011) and preceded by a 5-bit pointer (e.g., the bits PPPPP)that may indicate where in the source word 302 the first bit was removed and a type bit (e.g., T, where G=0 and I=1) that indicate the type of constraint violation. The removal of the constraint violation and the insertion of the position and type indicator bits may generate a 38-bit word as shown. In the example shown, a global violation starts at location 14. Therefore, position bits PPPPP=01110 (e.g., 14) and type bit T=0. The lower order bits (e.g., B) generally are mapped one-for-one. The pointer PPPPP and the type indicator T may be inserted at any appropriate predetermined position (e.g., bit location) in the partially coded word 312 to meet the design criteria of a particular application.

Figure 5:
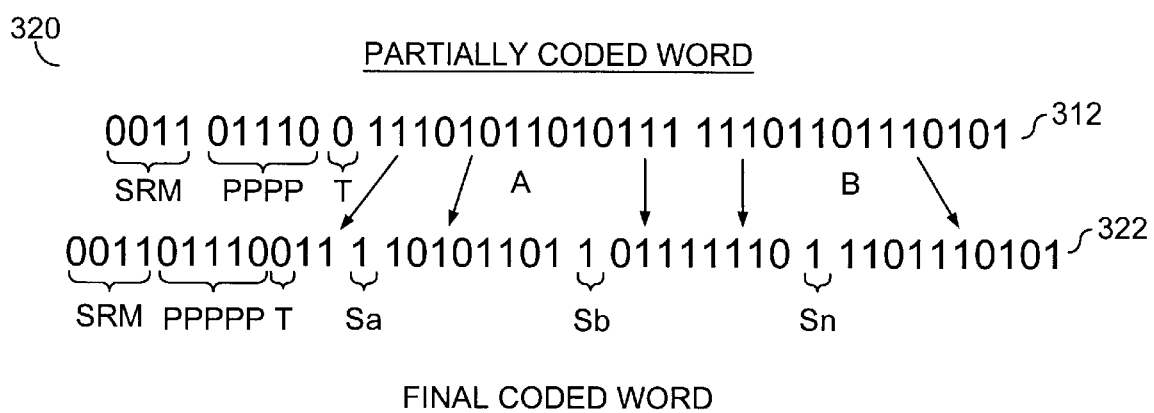
FIG. 5 is a diagram illustrating an example of constraint breaking bit stuffing.

Referring to FIG. 5, an example of a bit stuffing step 320 is shown. The bit stuffing step 320 may be implemented to generate a final coded word 322. The final coded word 322 may be similar to the code word 304. The constraint breaking bit stuffing step 320 may be implemented if the code word 304 contains a second type of constraint violation (e.g., constrain violation within the partially coded words 312). Bit stuffing may be implemented after the sequence replacement step 310 described in connection with FIG. 4.

When the sequence replacement 310 is performed, there is generally no guarantee that the resulting 38-bit partially coded word 312 does not have a constraint violation. In particular, segment "A" or "B" may have had an uncorrected constraint violation. Also, a constraint violation may occur when segments "A" and "i" are concatenated. However, the partially coded word 312 is generally only 38-bits long and the final code word 322 is generally 41 bits long. There are three bits available in the generation of the final coded word 322 from the partially coded word 312 that may be configured to break possible constraint violations by stuffing ones (e.g., logical HIGH) at fixed (e.g., predetermined) locations in the word 322. In the example illustrated in FIG. 5, the predetermined stuff bits (e.g., Sa, Sb and Sn) may be inserted at locations that were chosen (e.g., selected or predetermined) to be bits 10, 19, and 28. The number of stuff bits S is generally equal to the difference between the bit-width of the partially coded word 312 and the final coded word 322 (or the coded word 304). However, any appropriate number, type (e.g., one or zero), and /or location for the stuff bits S may be implemented to meet the design criteria of a particular application.

Careful analysis may show that the above encoding process (e.g., the steps 300, 310 and 320), is generally reversible (e.g., the encoding may be decoded). The encoding process also generally meets a number of constraints. In the discussion that follows, the term "Global left" may be defined as the maximum number of consecutive zeroes (e.g., bits at a LOW logic state) that occur in a valid code word 304 and/or 322 on the left (e.g., the upper or most significant bits). The "Global left" value is generally two since the worst case condition may be the SRM (0011) which has two zeroes on the left. In particular, for the example of a 40 bit source word 302 and a 41-bit code word 304 (and/or final code word 322) the following worst case conditions may be similarly defined.

Global left=2
Global right=11
Global center=11
Interleave left=1
Interleave right=11
Interleave center=11

An example of a worst case condition may occur when two code words 304 (and/or 322) are concatenated together. For instance, if one code word 304 (and/or 322) had two zeroes on the left and another code word 304 (and/or 322) had 11 zeroes on the right, a sequence of 13 consecutive zeroes may be generated when the two code words 304 (and/or 322) are concatenated together. Therefore, the final global constraint may be implemented as 13 bits and the final interleave constraint may be implemented as 12 bits for such an example.

Decoding generally occurs by first examining (comparing) the last (e.g., the most significant) four bits of the code word 304 and/or 322. Eight of the sixteen combinations of these last four bits may correspond to valid suffixes. Seven combinations may correspond to invalid suffixes (e.g., an error may be detected), and one four-bit sequence may be implemented as the sequence replacement mark (SRM). The following is an example of a decoding comparison of the upper 4 bits to expected (or potential) values and the corresponding results:

0000>>000—Error detected
0001>>001—Error detected
0010>>010—Error detected
0011>>SRM—Sequence Replacement Mark
0100>>100—Error detected
0101>>101—Error detected
0110>>000
0111>>010
1000>>000—Error detected
1001>>001
1010>>010—Error detected
1011>>011
1100>>100
1101>>101
1110>>110
1111>>111

Figure 6:
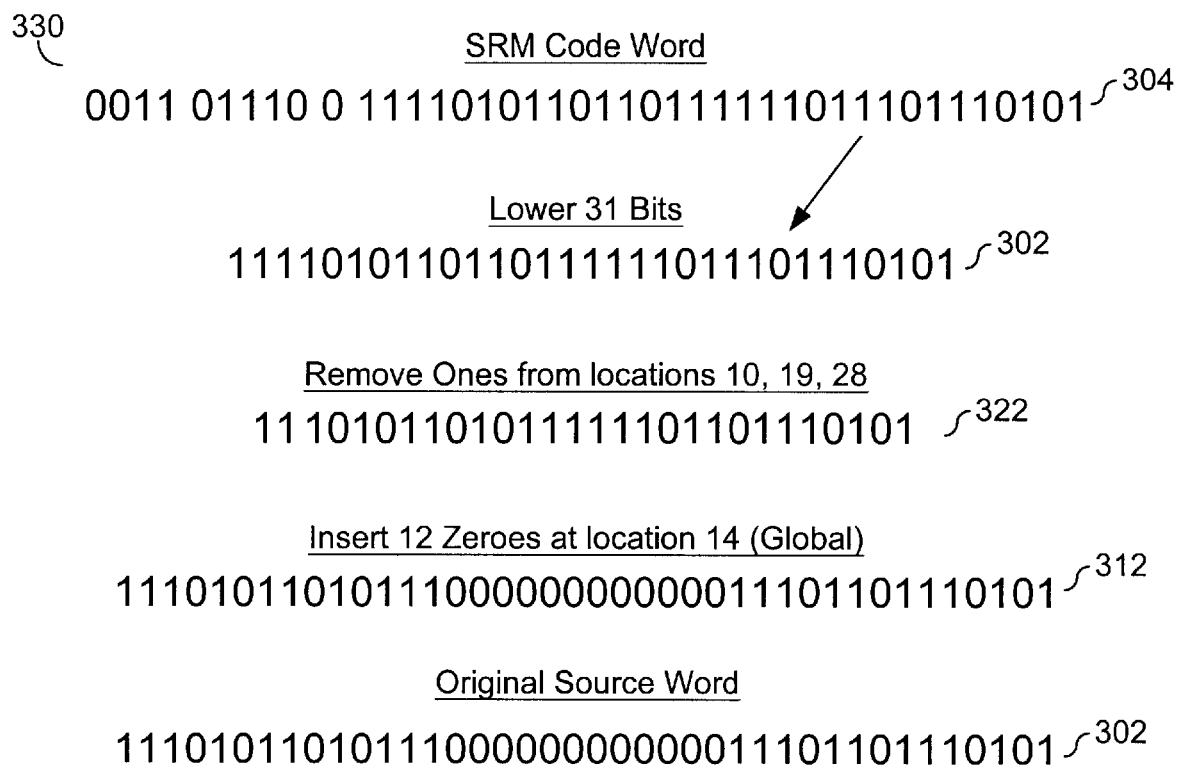
FIG. 6 is a diagram illustrating an example of decoding in accordance with a preferred embodiment of the present invention.

Referring to FIG. 6, an example a decoding step 330 is shown. In one example, the upper four bits are generally compared to the SRM and may not be (e.g., may not match) the SRM (e.g., 0011 in the example shown). In such an example, decoding is generally straight forward. The last four bits of the code word 304 are decoded as shown above and the remaining lower 37 bits are mapped one-for-one to generate the source word 302.

When the upper four bits of the code word (e.g., the final code word 322) are the SRM, then the examination step and/or steps of the code word 322 is generally performed to determine the decoding step and/or steps to perform. If the upper four bits of the coded word 322 are the SRM and the code word 322 is properly formed, then the reverse of the encoding process. (e.g., the reverse of the steps 300, 310 and 320) may be performed. In the example shown, first the stuff bits Sa–Sn at the locations 10, 19, and 28 are generally removed from the lower 31 bits of the code word 322. Next, 12 zeroes are generally inserted starting with the location designated by the pointer PPPPP, and zero insertion is performed in response to the type bit T (e.g., zero). In another example, interleave insertion may be performed in response to the type bit T=1.

If the upper four bits are a SRM and the code word 322 is not properly formed (not shown), then the lower 40 bits of the code word 322 may be mapped to the decoded (e.g., source) word 302 one-for-one. A properly formed code word 322 is generally defined having stuff bits S implemented as ones at locations 10, 19, and 28 and a pointer PPPPP within a possible (e.g., expected) range (e.g., less than bit location 29 for global constraint violations and less than bit location 18 for interleave constraint violations). The decoded word 302 is generally the same as the original source word 302 used in the above example.

Figure 7:
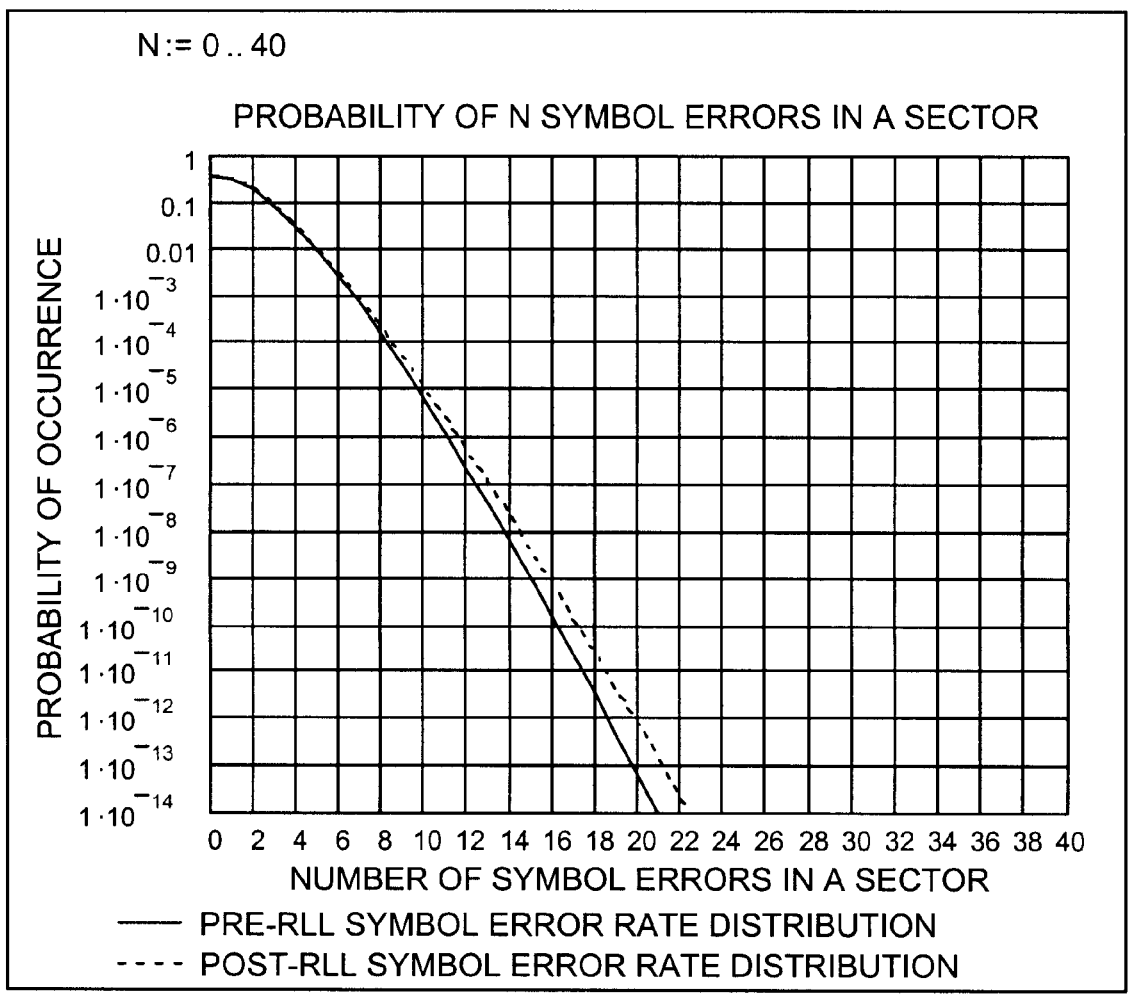
FIG. 7 is an example of error propagation analysis.

Referring to FIG. 7, an example of error propagation analysis 400 is shown. Error propagation analysis is often very complex and generally involves the statistical rate of occurrence of various errors and code words. To generate the plots shown in FIG. 7, errors may be injected into coded words. The number of ECC symbols (e.g., 10 bit symbols) that the were affected after decoding are generally evaluated. Errors may be injected with a statistical profile from a read channel simulation. For instance, an error was injected as a single bit 50% of the time, two bits 10% of the time, 3 bits 20% of the time, etc. Note that the error rate profile may be almost the same for the coded data (Post-RLL) as for the uncoded data (Pre-RLL).

Another qualitative way to understand the error propagation characteristics is to study the frequency and significance of error propagation for each class of code word. For instance, if an error occurred in the lower 37 bits of a suffix generated code word (e.g., generation of the code word 304 via the process 300), no error propagation will generally occur after decode since the lower 37 bits are mapped to the source word 302 one-for-one. If an error occurred in the suffix and converted the suffix into another different valid suffix, then a small amount of is error propagation may occur. For example, if a source word 302 had 000 for the upper three bits and a suffix of 0110 was generated in the code word 304. An error occurred and changed the 0110 suffix to a 1110 suffix. The decode of the 1110 suffix is generally 110. Thus, a single bit change in the coded word 304 resulted in a two-bit error in the decoded word 302. There may be six cases to consider in error propagation analysis. These cases may be as follows:

1) Suffix>>Not SRM
2) Suffix>>Invalid SRM
3) Suffix>>Valid SRM
4) SRM>>Invalid SRM
5) SRM>>Another valid SRM
6) SRM>>Not SRM Case 1 generally occurs the most frequently. However, Case 1 has almost no error propagation. Case 2 generally occurs much less frequently and also has almost no error propagation. Cases 3, 4, 5, and 6 may occur infrequently. However, cases 3–6 may have significant error propagation. Carefully constructed codes may be generated (e.g., the 40/41 code of the present invention) such that cases 3, 4, 5, and 6 are so infrequent as to not affect the correction power of the ECC in a statistically significant way. Thus, on a statistical basis, when the present invention is implemented the ECC may be presented with an error distribution profile virtually identical to uncoded data (e.g., no additional error propagation is generated due to constraint coding).

The code construction method of the present invention generally achieves the desirable properties of (i) a global constraint of 13 bits, (ii) interleave constraint of 12 bits, (iii)

low coding overhead (e.g., 40/41) source/coded word bit-widths, (iv) relatively simple encoding and decoding, (v) and/or good error propagation. Many other similar codes may be constructed by implementing the basic principles of the present invention, namely:

1) Suffix generation (e.g., constraint breaking with an extra code for SRM),
2) Sequence replacement, and
3) Constraint breaking bit stuffing.

By implementing the basic principles of the present invention in a coordinated fashion as shown above, a user may generate a class of constraint codes with low error propagation properties, low coding overhead, and/or relatively simple encoding and decoding. The present invention may be implemented via hardware (e.g., one or more circuits), firmware, software and/or any combination thereof.

While the invention has been particularly shown and described with reference to the preferred embodiments thereof, it will be understood by those skilled in the art that various changes in form and details may be made without departing from the spirit and scope of the invention.

What is claimed is:

1. A method for generating constraint codes in a stream of data having a plurality of multi-bit source words, comprising the steps of:
   (A) checking a sequence portion of said source words for one or more constraint violations; and
   (B) if no constraint violations are detected, modifying a predetermined portion of each of said source words to generate a plurality of corresponding multi-bit code words configured to prevent said constraint violations of said sequence portions across an adjacent two of said multi-bit code words, wherein said constraint violations comprise interleave constraint violations having a predetermined bit-width of consecutive bits at alternating states.

2. The method according to claim 1, wherein step (B) further comprises the sub-step of:
   (B-1) if a first type of constraint violation is detected in a particular source word, removing said sequence portion of said particular word to prevent said first type of constraint violation.

3. The method according to claim 2, wherein step (B) further comprises the sub-steps of:
   (B-2) modifying said predetermined portion of said source word to a sequence replacement mark (SRM);
   (B-3) inserting a pointer configured to indicate a relative bit position where said sequence portion was removed; and
   (B-4) inserting a type indicator configured to indicate a type of constraint violation that was removed, wherein sub-steps (B-2), (B-3), and (B-4) are configured to generate a partially coded word.

4. The method according to claim 3, wherein step (B) further comprises the sub-step of:
   (B-5) stuffing a number of bits at a particular state equal to a bit-width difference between said partially coded word and said coded word at a number of predetermined locations in said partially coded word (i) to generate said coded word and (ii) to prevent a second type of constraint violation.

5. The method according to claim 1, wherein step (B) comprises mapping said predetermined portion from a first bit pattern to a corresponding second bit pattern.

6. The method according to claim 5, wherein said second bit pattern comprises a larger width bit pattern then said first bit pattern.

7. The method according to claim 3, wherein said SRM comprises a larger width bit pattern then said predetermined portion.

8. The method according to claim 1, wherein said constraint violations comprise global constraint violations.

9. The method according to claim 8, wherein said global constraint violations comprise a predetermined bit-width of consecutive bits at a particular state.

10. The method according to claim 4, wherein said second type of constraint violation comprises a violation generated by the generation of said partially coded word.

11. The method according to claim 5, wherein said method further comprises the steps of:
    comparing said predetermined portion of said code words to a sequence replacement mark (SRM); and
    when said predetermined portion does not match (i) decoding said predetermined portion of said code word to said corresponding first bit pattern and (ii) mapping remaining bits in said code word one-to-one to generate said source word.

12. The method according to claim 11, wherein said method further comprises the step of:
    when said predetermined portion of said code word matches said SRM (i) removing said stuffed bits from said code word and (ii) inserting said sequence portion at said relative bit position to generate said source word.

13. An encoding apparatus comprising one or more circuits configured to perform the steps of claim 1.

14. A decoding apparatus comprising one or more circuits configured to perform the steps of claim 11.

15. An apparatus for generating constraint codes in a stream of data having a plurality of multi-bit source words comprising:
    means for checking a sequence portion of said source words for one or more constraint violations; and
    means for modifying a predetermined portion of each of said source words to generate a plurality of corresponding multi-bit code words configured to prevent said constraint violations of said sequence portions across an adjacent two of said multi-bit code words if said constraint violations are not detected, wherein said constraint violations comprise interleave constraint violations having a predetermined bit-width of consecutive bits at alternating states.

16. An apparatus comprising:
    a first circuit configured to check a sequence portion of a plurality of multi-bit source words for one or more constraint violations, wherein said plurality of multi-bit words comprise a stream of data; and
    a second circuit configured to modify a predetermined portion of each of said source words to generate a plurality of corresponding multi-bit code words, wherein (A) said code words are configured to prevent said constraint violations of said sequence portions across an adjacent two of said multi-bit code words if said constraint violations are not detected, and (B) if a first type of constraint violation is detected said apparatus is further configured to (i) remove said sequence portion of a Particular word, (ii) modify said predetermined portion of said source word to a sequence replacement mark (SRM), (iii) insert a pointer configured to indicate a relative bit position where said sequence pattern was removed, (iv) insert a type indicator configured to indicate a type of violation that was removed, and (v) stuff a number of bits at a particular state at a number of predetermined locations to generate said coded word.

17. The apparatus according to claim 16, wherein said apparatus is further configured to (i) compare said predetermined portion of said code words to said SRM and (ii) when said predetermined portion of said code word does not match said SRM, decode said predetermined portion of said code word to a corresponding bit pattern and map remaining bits in said code word one-to-one to generate said source word.

18. The apparatus according to claim 17, wherein, when said predetermined portion of said code word matches said SRM said apparatus is further configured to (i) remove said stuffed bits from said code word and (ii) insert said sequence portion at said relative bit position to generate said source word.

19. A method for generating constraint codes in a stream of data having a plurality of multi-bit source words, comprising the steps of:

(A) checking a sequence portion of said source words for one or more constraint violations; and (B) if no constraint violations are detected, modifying a predetermined portion of each of said source words to generate a plurality of corresponding multi-bit code words configured to prevent said constraint violations of said sequence portions across an adjacent two of said multi-bit code words, wherein step (B) comprises mapping said predetermined portion from a first bit pattern to a corresponding second bit pattern, wherein said second bit pattern comprises a larger width bit pattern then said first bit pattern.

* * * * *